US 6,532,514 B1

(12) United States Patent
Haroun et al.

(10) Patent No.: US 6,532,514 B1
(45) Date of Patent: Mar. 11, 2003

(54) SYSTEM AND METHOD FOR HANDLING A POWER SUPPLY INTERRUPTION IN A NON-VOLATILE MEMORY

(75) Inventors: Baher S. Haroun, Allen, TX (US); Uming U. Ko, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 157 days.

(21) Appl. No.: 09/713,564

(22) Filed: Nov. 15, 2000

Related U.S. Application Data

(60) Provisional application No. 60/171,780, filed on Dec. 22, 1999.

(51) Int. Cl.$^7$ .............................................. G06F 12/00
(52) U.S. Cl. ...................... 711/103; 365/185.33; 712/37
(58) Field of Search ........ 711/103; 365/185.01–185.33; 712/37

(56) References Cited

U.S. PATENT DOCUMENTS

| 5,377,145 | A | * | 12/1994 | Kynett et al. ........... 365/185.22 |
|---|---|---|---|---|
| 5,473,765 | A | * | 12/1995 | Gibbons et al. ............... 703/24 |
| 5,524,230 | A | * | 6/1996 | Sakaue et al. ............... 711/103 |
| 5,544,119 | A | * | 8/1996 | Wells et al. ........... 365/185.11 |
| 5,740,395 | A | * | 4/1998 | Wells et al. ............... 711/103 |
| 5,978,273 | A | * | 11/1999 | Shigemura ............. 365/185.29 |

* cited by examiner

Primary Examiner—Do Hyun Yoo
Assistant Examiner—Nasser Moazzami
(74) Attorney, Agent, or Firm—Robert D. Marshall, Jr.; W. James Brady, III; Frederick J. Telecky, Jr.

(57) ABSTRACT

A system for handling a power supply interruption in a non-volatile memory (10) is disclosed that includes a status indicator set (20) for each sector (16) of a non-volatile memory array (14). The status indicator set (20) is operable to indicate a status for the sector (16) and is independently erasable from the sector (16). A state machine (30) is operable to perform operations on the sectors (16). The state machine (30) is also operable to adjust the status indicator set (20) for a sector (16) prior to performing an operation on the sector (16) to indicate an interruption status and to adjust the status indicator set (20) for the sector (16) after completing the operation to indicate a completed status. Status indicator set (20) preferably includes alternatively employed active indicator sub-sets and erase indicator sub-sets.

13 Claims, 1 Drawing Sheet

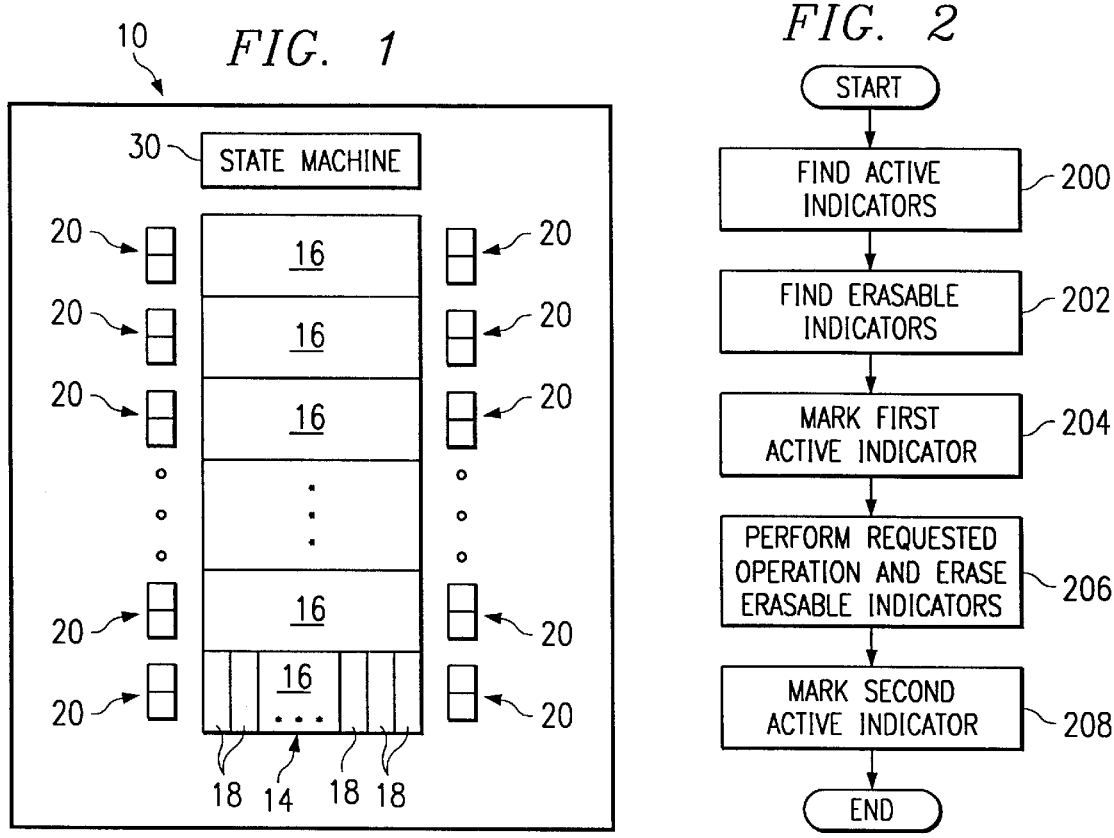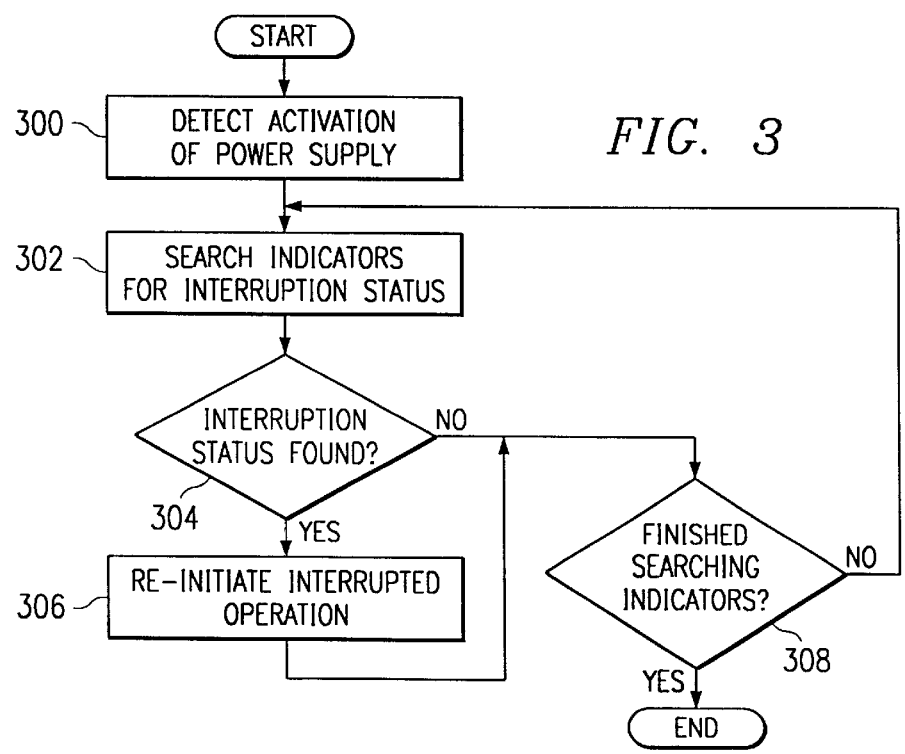

SYSTEM AND METHOD FOR HANDLING A POWER SUPPLY INTERRUPTION IN A NON-VOLATILE MEMORY

This application claims priority under 35 USC §119(e)(1) of Provisional Application No. 60/171,780, filed Dec. 22, 1999.

TECHNICAL FIELD OF THE INVENTION

This invention relates generally to semiconductor devices and more particularly to a system and method for handling a power supply interruption in a non-volatile memory.

BACKGROUND OF THE INVENTION

Non-volatile memories retain information in the absence of power. Examples of non-volatile memories include flash memory, erasable programmable read-only memory (EPROM), and electrically-erasable programmable read-only memory (EEPROM). Non-volatile memories may be used in a variety of electronic devices, such as microcontrollers, to provide storage capability.

A typical non-volatile memory requires a relatively long period of time for an erase operation, as compared with the amount of time for a read or a write operation. Because of this, a non-recoverable malfunction can occur when power to the non-volatile memory is interrupted during an erase operation. This power interruption can occur for a variety of reasons. For example, with cellular telephones and other battery-operated devices, a user may inadvertently remove the battery while an erase operation is being performed.

Typical non-volatile memories may include certain types of NOR flash cells that can go into depletion after being erased. If just one NOR flash cell goes into depletion, the entire sector of cells, as well as any other cells sharing the same bit line, may be corrupted. This problem is generally overcome by a process known as compaction that is performed after the erase operation. However, if a power supply interruption occurs before the compaction is completed, non-recoverable malfunction may result.

Previous attempts to solve this problem have included the introduction of split-gate cells as replacements for the NOR flash cells. The split-gate cells do not go into depletion upon erasure. However, the use of split-gate cells has the disadvantages of increased area requirements and reduced performance in terms of speed as compared to the NOR flash cells.

Previous attempts to solve this problem have also included the use of software solutions that require either two arrays of flash or the placement of tracking bits in sectors other than those being erased. However, disadvantages associated with software solutions such as these include the consumption of flash memory for data and for programming, as well as increased time and power requirements. Additionally, these solutions increase the complexity of the associated hardware. All of these disadvantages result in an increased cost for the non-volatile memory.

SUMMARY OF THE INVENTION

In accordance with the present invention, a system and method for handling a power supply interruption in a non-volatile memory are provided that substantially eliminate or reduce disadvantages and problems associated with previously developed systems and methods. In particular, the power supply interruption problems associated with NOR flash cells are solved without increasing area requirements or lowering performance.

In one embodiment of the present invention, a system for handling a power supply interruption in a non-volatile memory is provided that includes a status indicator set for each sector of a non-volatile memory array. The status indicator set is operable to indicate a status for the sector and is independently erasable from the sector. A state machine is operable to perform operations on the sectors. The state machine is also operable to adjust the status indicator set for a sector prior to performing an operation on the sector to indicate an interruption status and to adjust the status indicator set for the sector after completing the operation to indicate a completed status.

Technical advantages of the present invention include providing an improved system for handling a power supply interruption in a non-volatile memory. In particular, a status indicator for a sector is marked prior to the performance of an operation and erased after successful completion of the operation. As a result, interrupted operations are detected at power up based on a marked status indicator. Thus, the power supply interruption problems associated with NOR flash cells are solved without increasing area requirements or lowering performance. In addition, the cost of the memory is reduced, as well as time and power requirements.

Other technical advantages will be readily apparent to one skilled in the art from the following figures, description, and claims.

BRIEF DESCRIPTION OF THE DRAWINGS

For a more complete understanding of the present invention and its advantages, reference is now made to the following description taken in conjunction with the accompanying drawings, wherein like numerals represent like parts, in which:

FIG. 1 is a block diagram illustrating a system for handling a power supply interruption in a non-volatile memory in accordance with one embodiment of the present invention;

FIG. 2 is a flow diagram illustrating a method for performing an operation in a non-volatile memory with the system of FIG. 1 in accordance with one embodiment of the present invention; and FIG. 3 is a flow diagram illustrating a method for handling a power supply interruption in a non-volatile memory occurring during the execution of the method of FIG. 2 in accordance with one embodiment of the present invention.

DETAILED DESCRIPTION OF THE INVENTION

FIG. 1 is a block diagram illustrating a non-volatile memory capable of detecting and correcting effects of power supply interruptions in accordance with one embodiment of the present invention. The non-volatile memory 10 comprises one or more memory arrays 14, each having a plurality of sectors 16, status indicators 20 associated with each sector 16, and a state machine 30. The state machine 30 comprises hardware logic devices and/or software capable of operating the memory array 14 and the status indicators 20.

The sectors 16 each comprise a plurality of cells 18. As used herein, each means every one of at least a subset of the identified items. Each cell 18 typically stores a bit of data. However, it will be understood that the cells 18 may store a byte or other amount of data without departing from the scope of the present invention. The data in each cell 18 is stored such that the data is retained in the absence of power.

For an exemplary memory array 14 in which each cell 18 stores a bit of data, each cell 18 comprises a floating gate transistor having a source, a drain, a floating gate and a control gate. Each of the control gates in a sector 16 of cells 18 is connected to a word line. In addition to being grouped in sectors 16, the cells 18 may be grouped in columns. A column of cells 18 includes one cell 18 from each sector 16, with all the cells 18 in a column aligned with each other. Each of the drains in a column of cells 18 is connected to a bit line.

In operation of the exemplary memory array 14, a cell 18 is selected by activating the corresponding word line and bit line. In a write or program mode, programming voltages are then applied to the selected cell 18 which create a high current condition in a channel of the cell 18. The high current condition results in the generation of channel-hot electrons and avalanche-breakdown electrons that are injected into the floating gate of the selected cell 18, causing the cell 18 to be programmed to a logic 1.

In an erase mode, a sector 16 is selected by activating the corresponding word line and all the bit lines. Relatively high erase voltages are applied to the selected sector 16 to create sufficient field strength across the tunneling area between the floating gates and the substrates of the cells 18 in the selected sector 16 to generate a tunnel current that allows the floating gates to discharge, thereby erasing the cells 18 to a logic 0.

In a read mode, a cell 18 is selected by activating the corresponding word line and bit line. Read voltages are then applied to the selected cell 18 which allow the logic state of the cell 18 to be provided to an output terminal. The read voltages applied to the cell 18 are insufficient to create either hot-carrier injection or tunneling that could disturb the charge condition of the floating gate and thereby alter the logic state of the cell 18.

Typically, the write mode and the read mode are relatively short, while the erase mode is relatively long. This is determined by the amount of time required to perform the operation relative to the amount of time that the capacitance of the memory 10 is able to provide power after removal of a power supply. In the exemplary embodiment, this amount of time is about 10 to about 20 microseconds. Thus, although the embodiment described involves a slow erase operation, it will be understood that the teachings of the present invention may be applied to any operation that requires more time to complete than is offered by the capacitance of the memory 10.

The status indicators 20 are associated with each sector 16 for indicating the status of the associated sector 16, as described in more detail below. The status indicators 20 are independently erasable with respect to the sectors 16. According to the described embodiment, the status indicators 20 comprise one bit of data. It will be understood, however, that the status indicators 20 may be otherwise suitably implemented without departing from the scope of the present invention.

For the exemplary embodiment, each sector 16 is associated with four status indicators 20. These status indicators 20 may be located adjacent or near to the associated sector 16 or may form part of the sector 16, provided that the indicators 20 are independently erasable from the sector 16. The four indicators 20 are grouped into two sets of two indicators 20, with the two sets of indicators 20 alternating between active indicators 20 and erasable indicators 20. As described in more detail below, the use of four indicators 20 in two sets allow the state machine 30 to identify interrupted operations. Other suitable patterns of status indicators 20 may be used.

The state machine 30 performs operations on the sectors 16 of the memory array 14 and updates the status indicators 20. The state machine 30 maybe internal or external to the memory 10. In the exemplary embodiment, the state machine 30 is coupled to the memory array 14 through row and column address drivers that activate the rows and columns to access the cells 18.

In operation, the state machine 30 issues an instruction or receives a request from an external controller to erase a sector 16 of the memory array 14. The state machine 30 then determines which set of indicators 20 includes the active indicators 20 at that time. According to one embodiment, this determination is made by identifying the indicators 20 that are both at logic 0. Although the described embodiment includes logic 0 and logic 1 distinctions, it will be understood that the descriptions involving logic 0 and logic 1 may be reversed without departing from the scope of the present invention.

After identifying the active indicators 20, the state machine 30 marks the first active indicator 20 by programming the indicator 20 to a logic 1. The state machine 30 then proceeds to perform the erase operation on the sector 16. The state machine 30 also erases the erasable indicators 20 to a logic 0. The erase of the erasable indicators 20 is performed concurrently with the erase of the sector 16, thereby reducing the total amount of time required to complete the erase operation. After completing the erase operation, the state machine 30 marks the second active indicator 20 by programming the indicator 20 to a logic 1. Thus, after a successful erase operation, the previous active indicators 20 become the erasable indicators 20 for the subsequent erase operation and the previous erasable indicators 20 become the active indicators 20.

While the erase operation is being performed on the sector 16, the active indicators 20 are mismatched, with the first active indicator 20 being a logic 1 and the second active indicator 20 being a logic 0. If a power supply interruption should occur during this operation, the indicators 20 will remain in these mismatched logic states because the indicators 20 comprise a non-volatile memory store which is unaffected by loss of power. Upon re-activation of the power supply, the state machine 30 is able to determine that an erase operation was interrupted for a particular sector 16 based on the mismatched logic states of the indicators 20 associated with that sector 16. Thus, the state machine 30 searches all of the indicators 20 upon activation of a power supply and determines whether or not a potentially destructive power supply interruption occurred based on the logic states of the indicators 20 as illustrated in the following table:

| Status of Indicators | Interpretation |
| --- | --- |
| 0 0 | No Error/ Active Indicators |
| 1 1 | No Error/ Erasable Indicators |
| 1 0 | Operation Interrupted |
| 0 1 | Illegal Combination |

Therefore, if an erase operation was interrupted, at least one of the two sets of indicators 20 will be a 1/0 combination. In the event that a 1/0 combination is found for either of the sets of indicators 20, the logic states for the other set of indicators 20 are irrelevant. If all erase operations were completed prior to the power supply interruption, the logic states for the sets of indicators 20 will be 0/0 for the active indicators 20 and 1/1 for the erasable indicators 20. The 0/1 combination should never occur and is thus considered an illegal combination. If the 0/1 combination is found, the data in the associated sector 16 may be treated as corrupted data and erased.

For an alternative embodiment, only one status indicator 20 is associated with each sector 16. This embodiment is useful for a memory 10 that allows both writing and erasing operations to be performed in a relatively short amount of time relative to the power-providing capabilities of the capacitance of the memory 10. For this embodiment, the state machine 30 issues an instruction or receives a request from an external controller to erase a sector 16 of the memory array 14. At this point, the state machine 30 marks the indicator 20 by programming the indicator 20 to a logic 1. Although the described embodiment includes logic 0 and logic 1 distinctions, it will be understood that the descriptions involving logic 0 and logic 1 may be reversed without departing from the scope of the present invention.

The state machine 30 then proceeds to perform the erase operation on the sector 16. After completing the erase operation, the state machine 30 erases the indicator 20 to a logic 0. Thus, while an erase operation is being performed on the sector 16, the indicator 20 is a logic 1; otherwise, the indicator 20 is a logic 0. If a power supply interruption should occur during an erase operation, the indicator 20 will remain in the state of logic 1 because the indicator 20 comprises a non-volatile memory store which is unaffected by loss of power.

Upon re-activation of the power supply, the state machine 30 is able to determine that an erase operation was interrupted for a particular sector 16 based on the logic state of the indicator 20 associated with that sector 16. Thus, the state machine 30 searches all of the indicators 20 upon activation of a power supply and determines that a potentially destructive power supply interruption occurred by finding an indicator 20 in a state of logic 1. If all erase operations were completed prior to the power supply interruption, however, the logic states for the indicators 20 will be 0.

FIG. 2 is a flow diagram illustrating a method for performing an operation in the non-volatile memory 10 in accordance with one embodiment of the present invention. The method begins at step 200 where the state machine 30 identifies the active indicators 20 for a sector 16 to be erased based on the logic states of the indicators 20. At step 202, the state machine 30 identifies the erasable indicators 20 for the sector 16 to be erased based on the logic states of the indicators 20. The active and erasable indicators 20 may be identified by pointers, counters, equations, and the like. At step 204, the state machine 30 marks the first active indicator 20. At step 206, the state machine 30 performs the erase operation on the sector 16 and erases the erasable indicators 20 concurrently. At step 208, the state machine 30 marks the second active indicator 20, at which point the method comes to an end. Thus, both sets of indicators 20 are matched to indicate the successful completion of the operation.

FIG. 3 is a flow diagram illustrating a method for handling a power supply interruption in the non-volatile memory 10 occurring during the execution of the method of FIG. 2 in accordance with one embodiment of the present invention. The method begins at step 300 where the state machine 30 detects the activation of the power supply. At step 302, the state machine 30 searches the indicators 20 associated with a sector 16 for an interruption status.

At decisional step 304, the state machine 30 determines whether the indicators 20 for the sector 16 are mismatched or otherwise consistent with an interruption status. If no interruption status is found for the sector 16, any erase operations performed on that sector 16 have been completed successfully and the method follows the No branch from decisional step 304. However, if an interruption status is found, an erase operation on that sector 16 was interrupted and the method follows the Yes branch from decisional step 304 to step 306 where the interrupted operation is re-initiated. The status indicators 20 remain mismatched until the erase operation is successfully completed, after which the indicators 20 are matched to indicate a successful operation. Step 306 leads to decisional step 308.

At decisional step 308, the state machine 30 determines whether all of the indicators 20 for all of the sectors 16 have been searched for an interruption status. If the state machine 30 has finished searching the indicators 20, the method follows the Yes branch from decisional step 308 and the method comes to an end. However, if the state machine 30 has not finished searching the indicators 20, the method follows the No branch from decisional step 308 and returns to step 302 where the search is continued starting with the indicators 20 for the next sector 16. It will be understood that the search may be completed by the state machine 30 before the interrupted operations are initiated without departing from the scope of the present invention.

Although the present invention has been described with several embodiments, various changes and modifications may be suggested to one skilled in the art. It is intended that the present invention encompass such changes and modifications as fall within the scope of the appended claims.

What is claimed is:

1. A system for handling a power supply interruption in a non-volatile memory, comprising:

a status indicator set for each sector of a non-volatile memory array, the status indicator set operable to indicate a status for the sector and independently erasable from the sector; the status indicator set comprising alternating active indicator and erasable indicator sub-sets, the indicator sub-sets independently erasable from each other, each indicator sub-set comprising a first and second indicators, the state machine operable to mark a first indicator of the active indicator sub-set for a sector prior to performing an operation on the sector to indicate an interruption status, to erase the erasable indicator sub-set, and to mark the second indicator of the active indicator sub-set for the sector after completing the operation to indicate a completed status, the state machine further operable to perform operations on sectors and operable to adjust the status indicator set for a sector prior to performing an operation on the sector to indicate an interruption status and to adjust the status indicator set for the sector after completing the operation to indicate a completed status.

2. The system of claim 1, the state machine further operable to search the status indicator sets for an interruption status upon activation of a power supply and to initiate the operation for the sector having a status indicator set indicating an interruption status.

3. The system of claim 1, wherein the erasable indicator sub-sets become the active indicator sub-sets and the active indicator sub-sets become the erasable indicator sub-sets after the operation is completed.

4. The system of claim 1, the state machine operable to adjust the status indicator set for a sector prior to performing an erase operation on the sector and to adjust the status indicator set for the sector after completing the erase operation.

5. A non-volatile memory, comprising:

a memory array including a plurality of sectors operable to store data;

a status indicator set for each sector of the memory array, the status indicator set operable to indicate a status for the sector and independently erasable from the sector, the status indicator set comprising alternating active indicator and erasable indicator sub-sets, the indicator sub-sets independently erasable from each other, each indicator sub-set comprising a first and second indicators, a state machine operable to mark a first indicator of the active indicator sub-set for a sector prior to performing an operation on the sector to indicate an interruption status, to erase the erasable indicator sub-set, and to mark the second indicator of the active indicator sub-set for the sector after completing the operation to indicate a completed status, the state machine further operable to perform operations on sectors and operable to adjust the status indicator set for a sector prior to performing an operation on the sector to indicate an interruption status and to adjust the status indicator set for the sector after completing the operation to indicate a completed status.

6. The memory of claim 5, the state machine further operable to search the status indicator sets for an interruption status upon activation of a power supply and to initiate the operation for the sector having a status indicator set indicating an interruption status.

7. The memory of claim 5, wherein the erasable indicator sub-sets become the active indicator sub-sets and the active indicator sub-sets become the erasable indicator sub-sets after the operation is completed.

8. The memory of claim 5, the state machine operable to adjust the status indicator set for a sector prior to performing an erase operation on the sector and to adjust the status indicator set for the sector after completing the erase operation.

9. A method for handling a power supply interruption in a non-volatile memory, comprising:

associating a status indicator set with each of a plurality of sectors of a non-volatile memory, the status indicator set comprising alternating active indicator and erasable indicator sub-sets, each indicator sub-set comprising a first and second indicators;

selecting a sector upon which to perform an operation;

adjusting the status indicator set for the selected sector prior to performing the operation to indicate an interruption status; and adjusting the status indicator set for the selected sector after completing the operation to indicate a completed status.

10. The method of claim 9, further comprising:

searching the status indicator sets for an interruption status upon activation of a power supply; and initiating the operation for the sector having a status indicator set indicating an interruption status.

11. The method of claim 9, adjusting the status indicator set for the selected sector prior to performing the operation to indicate an interruption status comprising marking a first indicator of the active indicator sub-set, and adjusting the status indicator set for the selected sector after completing the operation to indicate a completed status comprising marking the second indicator of the active indicator sub-set.

12. The method of claim 11, further comprising erasing the erasable indicator sub-sets prior to marking the second indicator of the active indicator sub-set.

13. The method of claim 12, wherein the erasable indicator sub-sets become the active indicator sub-sets and the active indicator sub-sets become the erasable indicator sub-sets after the operation is completed.

* * * * *